United States Patent [19]

Eash

[11] Patent Number: 4,820,985

[45] Date of Patent: Apr. 11, 1989

[54] APPARATUS FOR TUNING AN NMR FIELD COIL

[75] Inventor: Matthew G. Eash, Oconomowoc, Wis.

[73] Assignee: General Electric Company, Milwaukee, Wis.

[21] Appl. No.: 178,278

[22] Filed: Apr. 6, 1988

[51] Int. Cl.⁴ .......................................... G01R 33/20
[52] U.S. Cl. ..................................... 324/318; 324/322
[58] Field of Search .............. 324/318, 322, 316, 319, 324/313, 314, 307; 333/221, 219

[56] References Cited

U.S. PATENT DOCUMENTS

| | | | |
|---|---|---|---|
| 4,638,253 | 1/1987 | Jaskolski et al. | 324/318 |
| 4,642,569 | 2/1987 | Hayes et al. | 324/318 |
| 4,680,548 | 7/1987 | Edelstein et al. | 324/318 |
| 4,680,551 | 7/1987 | O'Donnell et al. | 324/320 |
| 4,692,705 | 9/1987 | Hayes | 324/322 |
| 4,694,255 | 9/1987 | Hayes | 324/322 |

Primary Examiner—Stewart J. Levy
Assistant Examiner—Louis M. Arana
Attorney, Agent, or Firm—Quarles & Brady

[57] ABSTRACT

A coil assembly for radio frequency NMR imaging is designed to resonate at a desired frequency. The assembly includes a cylindrical field coil having a pair of conductive end loops disposed in a spaced-apart relation along a central axis. A plurality of conductive segments electrically interconnect the conductive end loops at periodic points around their periphery. These conductive segments include reactive elements which cause the field coil to resonate at a given frequency. A magnetic shield is disposed about the field coil. A plurality of reactive shunts are coupled between different locations about the periphery of the field coil and a common electrical node, such as the shield. Each of the reactive shunts is variable to increase or decrease the resonant frequency of the field coil, thereby tuning it to the desired frequency.

12 Claims, 3 Drawing Sheets

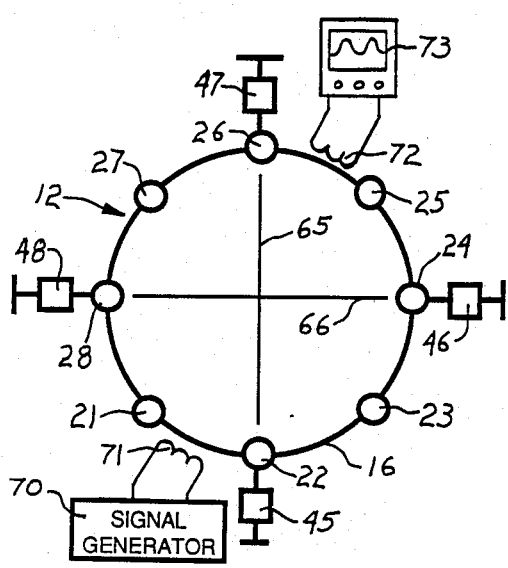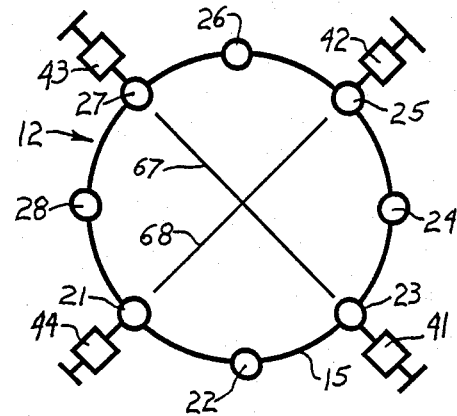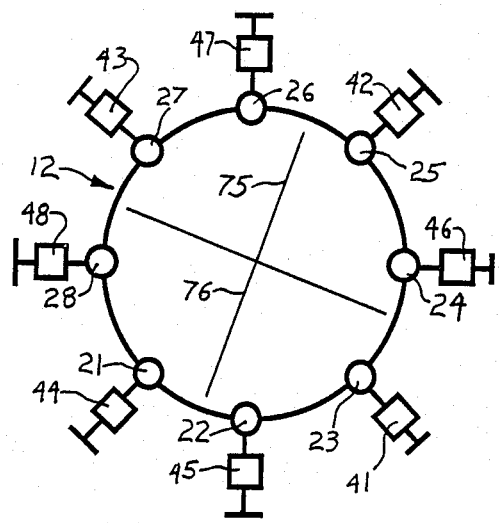
FIG. 6  FIG. 7
FIG. 8

APPARATUS FOR TUNING AN NMR FIELD COIL

BACKGROUND OF THE INVENTION

The field of the invention is nuclear magnetic resonance imaging methods and systems. More particularly, the present invention relates to the tuning of a resonant coil which is excited to create a radio frequency magnetic field.

Any atomic nucleus which possesses a magnetic moment attempts to align itself with the direction of the magnetic field in which it is located. In doing so, however, the nucleus precesses around this direction at a characteristic angular frequency (the Larmor frequency) which is dependent on the strength of the magnetic field and on the properties of the specific nuclear species (the magnetogyric constant q of the nucleus). Nuclei which exhibit this phenomena are referred to herein as "spins".

When a substance such as human tissue is subjected to a uniform static magnetic field (polarizing field $B_z$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, also is subjected to a radio frequency excitation field ($B_1$) which is in the x-y plane and which is at the Larmor frequency, the net aligned moment, $M_1$, may be rotated, or "tipped", into the x-y plane to produce a net transverse magnetic moment $M_z$, which is rotating, or spinning, in the x-y plane at the Larmor frequency. The degree to which the net magnetic moment $M_z$ is tipped and, hence, the magnitude of the net transverse magnetic moment $M_1$, depends primarily on the length of time and magnitude of the applied RF excitation field $B_1$.

The practical value of this phenomenon resides in the signal which is emitted by the excited spins after the RF excitation field $B_1$ is terminated. In simple systems the excited spins induce an oscillating sine wave signal in a receiving coil. The frequency of this signal is the Larmor frequency, and its initial amplitude, $A_0$, is determined by the magnitude of the transverse magnetic moment $M_1$. The amplitude, A, of the emission signal decays in an exponential fashion with time, t, according to the equation:

$$A = A_0 e^{t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the RF excitation field $B_1$ in a perfectly homogeneous field. The signal emitted by the excited nuclei have particular application for medical imaging of the anatomical features of live human patients.

NMR imaging systems generate the excitation magnetic field $B_1$ using a body coil which is capable of handling large amounts of RF power to provide a homogeneous RF magnetic field throughout a large region. An example of a body coil is shown in U.S. Pat. No. 4,692,705 and is commonly referred to as a "cage coil" in that it is formed by two conductive end loops spaced apart along a central axis and interconnected by a number of axial conductive segments creating the appearance of a cage. Each of the conductive segments is provided with at least one reactive shunt such as a capacitor and the end loops also have a plurality of serially connected reactive shunts. This forms a tuned coil designed to resonate at the Larmor frequency.

The body coil is typically excited at two of its conductive segments spaced 90 degrees apart around the coil by two RF signals which are in quadrature. As a result of this excitation, the end loops of the coil carry a sinusoid distribution of current around them, thereby creating two orthogonal resonant modes within the coil. One mode carries current proportional to the sine of the angle around the loop, while the other mode carries current proportional to the cosine of that angle as given by:

$$V_1 = \cos \omega_1 t \text{ and } V_2 = \sin \omega_2 t$$

where $\omega$ is the frequency of the signal traveling around the coil. In a properly tuned NMR body coil, both of these modes will resonant at the Larmor frequency, (i.e. $\omega_1 = \omega_2$).

With a multi-element cage coil, the resonant frequency is primarily determined by the distributed inductances and discrete capacitances built into the resonance structure of the body coil. In order for the two modes to resonate at the same frequency, the reactance of each section of the coil must be uniform. Unfortunately, realistic manufacturing tolerances of the coil and its various reactive components make it virtually impossible to have a uniform reactance in all sections of the coil. This variation in reactance from section to section around the coil produces a separation in the resonant frequencies of the two modes, as well as a deviation from the desired Larmor frequency. Therefore, body coils have had to include some form of tuning mechanism in order to adjust the reactance of the coil sections so that both modes resonated at the Larmor frequency. This has been previously accomplished by introducing adjustable tuning elements in the end loops and conductive segments of the coil which cancel the effects of the tolerance variation in the coil elements. In a production environment, it is difficult and laborious to tune a coil with these elements since it is impossible to predict the angular direction of the two resonant modes and therefore, where to place tuning elements. This difficulty is compounded by the physical properties of the coil, which cause it to operate in the two orthogonal resonant modes where the frequency separation between the modes is the greatest. This tendency toward selecting the largest available frequency difference causes the coil to shift its modes into a new position whenever the frequency difference in the present modes is adjusted to zero. Thus, these adjustable tuning elements must be introduced into as many positions of the coil as practical in order to provide a combination of tuning elements in each direction where tuning is desired. The greater the number of tuning elements, the more complex the tuning task becomes.

SUMMARY OF THE INVENTION

A coil assembly for generating a radio frequency magnetic field in an NMR imaging system is intended to resonate at a desired frequency. The desired frequency is typically the Larmor frequency of the objects to be imaged. The assembly includes a cylindrical magnetic field coil having a pair of conductive end loops disposed in a spaced apart relation along a central axis and a plurality of conductive segments interconnecting the pair of conductive end loops at periodic points around each of the end loops. The end loops and conductive segments contain reactive components that cause the cylindrical field coil to resonate at a given frequency. A magnetic shield is disposed about the cylindrical field coil. A plurality of reactive shunts are coupled between different locations about the periphery of the field coil and a common electrical node. Each of the reactive shunts is variable to increase or decrease the resonant frequency of the field coil.

In the preferred embodiment of the present invention, each member of a first set of four reactive shunts is coupled to one of the end loops at a position 90 degrees around its circumference. Each member of a second set of four reactive shunts is coupled to the other end loop at positions 90 degrees around its circumference and which are offset by 45 degrees from the positions of the first conductive end loop at which the reactive shunts are coupled. In this embodiment, each of the reactive shunts extends between its respective end loop and the shield, which acts as the common electrical node.

Each of the reactive shunts can take any of several forms. In one form, the reactive shunts consist of a parallel connection of an inductor and a capacitor, at least one of which being variable, that are coupled between the common node and the coil. In a more practical embodiment, a transmission medium can be used to couple a variable impedance component to the desired position on the field coil so that the component can be located where it is easily accessible by a technician. In this variation of the present invention, the length of the transmission medium is selected to transform the impedance to produce the desired tuning impedance effect for the coil.

The general object of the present invention is to provide an NMR magnetic field coil which easily tuneable to resonate at its desired frequency.

A more specific object is to provide a tuning mechanism for the coil having a minimum number of adjustable components in order to compensate for all variations in the directions of the two resonant modes.

Another object of some of the embodiments of the present invention is to provide the tuning mechanism at locations which are easily accessible to a technician.

A further object of the present invention is to provide a mechanism for tuning the frequency of each resonant mode of the coil.

BRIEF DESCRIPTION OF THE DRAWINGS

FIGS. 6-8 depict top views of the present NMR field coil illustrating different direction orientations of the two resonant modes.

DETAILED DESCRIPTION OF THE INVENTION

Figure 1:
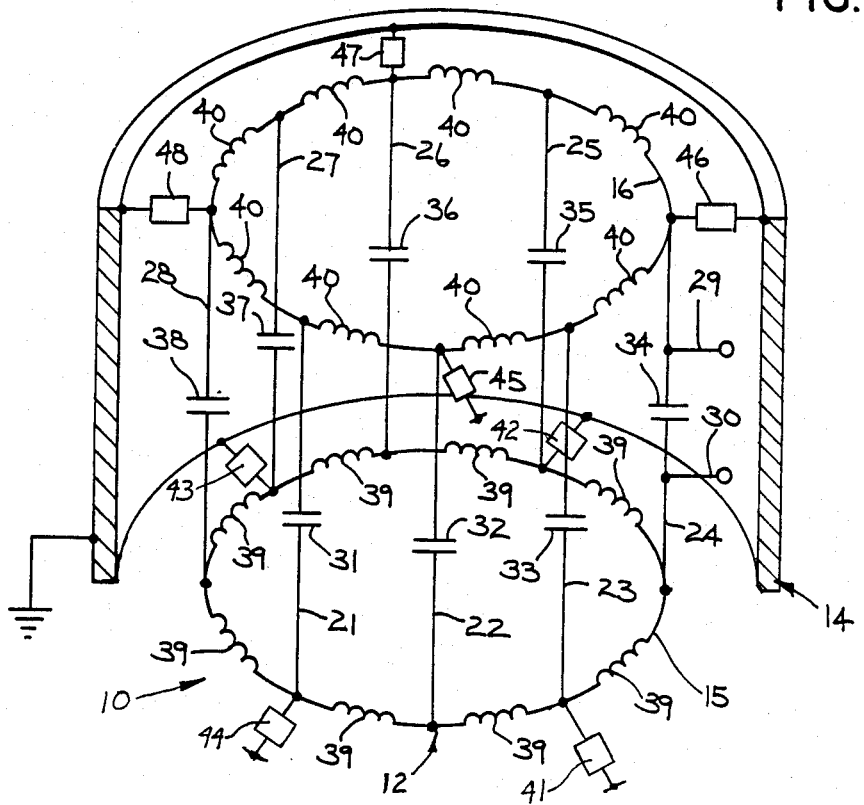
FIG. 1 schematically illustrates an NMR field coil assembly incorporating the present novel tuning mechanism.

With reference to FIG. 1, an NMR imaging system coil assembly 10 includes an excitation magnetic field coil 12 and a shield 14. The shield is a grounded tubular conductive element that is coaxial with the field coil 12 and other coils (not shown) as in a conventional NMR imaging system. The shield 14 acts to partially contain the magnetic field from the field coil 12. The field coil has two electrically conductive end loops 15 and 16 spaced apart along a common central axis. These end loops may be circular or elliptical depending upon the desired shape of the central opening of the coil assembly 10. The two end loops 15 and 16 are interconnected by eight axial conductive segments 21-28, forming a coil structure that resembles a cylindrical cage. Although the exemplary field coil 12 has eight conductive segments, the present invention can be utilized with cage type field coils having a greater or a lesser number of segments. Field coils of this type are described in detail in U.S. Pat. Nos. 4,680,548 and 4,692,705, which descriptions are incorporated herein.

Each of the conductive segments 21-28 is provided with at least one reactive element represented by a capacitors 31-38, respectively. Each of the conductive end loops 15 and 16 in the exemplary coil has one of eight serially connected inductive elements in each section of the loop between adjacent conductor segments 21-28. The inductive elements, designated 39 in the first end loop 15 and 40 in the second end loop 16, represent the distributed inductances inherent in the conductors of each loop. These inductances are needed to achieve the desired phase shifts for proper coil operation. The conductive segments 21-28 have similar distributed inductances associated with them, however these are not depicted in FIG. 1. In general, the inductances associated with the conductive segments 21-28 represent a smaller effect than the capacitive effect associated with each segment's discrete capacitors 31-38. The particular type of cage type field coil illustrated in FIG. 1 is referred to as a "low pass" coil. The present invention can be utilized with the other types of coils, such as "high pass" coils, described in the aforementioned U.S. patents.

The field coil 12 is excited by two radio frequency (RF) signals in quadrature. One signal is applied via leads 29 across the capacitor 32 of conductive segment 22. The other RF signal is applied via leads 30 and across the capacitor of another conductive segment 24 spaced 90 degrees around the coil from the first segment 22. For example, the frequency of these excitation signals in an NMR system for medical applications is approximately 64 Mhz, the Larmor frequency of protons in a 1.5 Tesla static $B_0$ magnetic field. The field coil 12 is designed to resonate at this excitation frequency in two orthogonal resonant modes. The field coil thus described is similar to those conventionally employed with NMR imaging systems.

The present invention provides a plurality of novel components to facilitate tuning of the conventional field coil. Each of the conductive end loops 15 and 16 is coupled to the shield 14 by four variable reactive shunts, shunts 41-44 for the first loop 15, and reactive shunts 45-48 for the second loop 16. The four reactive shunts for each end loop 15 and 16 are equidistantly spaced (90 degrees apart) around the loop. The points at which the four reactive shunts 41-44 are coupled to the first end loop 15 are preferably offset by 45 degrees around the coil from the points at which the four reactive shunts 45-48 are coupled to the second end loop 16. For example, the first reactive shunt 41 is coupled to the first loop 15 at its intersection with conductive segment 23 and reactive shunt 45 is coupled to the second end loop 16 at its connection point with conductive element 22. The purpose for this offset will become apparent in the subsequent explanation of the coil tuning operation. Although the reactive shunts 41-48 are shown connected directly to their respective end loop 15 or 16, the coupling of the reactive shunts to the end loops may be achieved by a connection of the reactive shunt to separate ones of the conductive segments 21-28.

Each of the reactive shunts 41-48 provides a tuneable impedance between the field coil 12 and a common electrical node, which is the shield 14 in the preferred embodiment. When the reactive shunt is tuned to be parallel resonant at the resonant frequency of the coil, it acts as an open circuit with no current flowing through the reactive shunt from the coil 12 to the shield 14. However, by varying the reactive shunt to become capacitive or an inductive, the impedance of a section of the field coil 12 is changed, thus altering the coil's resonance.

Figure 2:
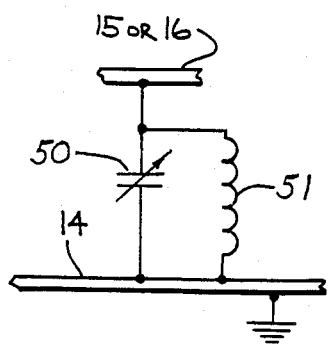
FIGS. 2-5 show four different embodiments for the reactive tuning shunts of the coil assembly in FIG. 1.

In the embodiment of the present invention shown in FIG. 2, the reactive shunts each comprise a variable capacitor 50 and a fixed inductor 51 connected in parallel between the respective points on the field coil end loops 15 or 16 and the shield 14. As noted above, when the values of the capacitor 50 and inductor 51 are tuned to resonate at the frequency of the signal applied to the coil, the reactive shunt appears as an open circuit between the coil 12 and shield 14. By adjusting the capacitor 50 from its value at the open circuit condition, the resultant impedance of the reactive shunt becomes capacitive or inductive depending upon whether the capacitor 50 was increased or decreased in value. When the reactive shunts are adjusted to act as a capacitance between the coil 12 and the shield 14, the resonant frequency of the coil is decreased. When the reactive shunts are adjusted to act as an inductance between the shield and the coil, the resonant frequency of the field coil 12 is increased.

Figure 3:
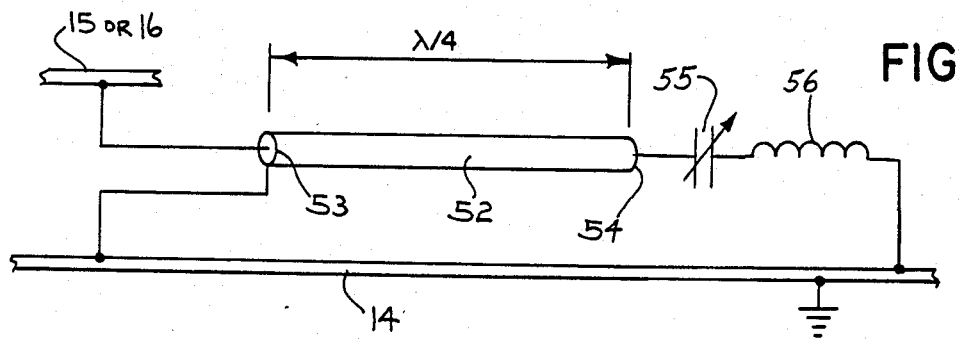

FIG. 3 shows an alternative embodiment for each of the reactive shunts which includes a signal transmission medium that enables the adjustable components of each shunt to be brought out of the coil from their points of connection to locations where they are easily accessible by a technician during the tuning process. Specifically, this embodiment of the reactive shunt includes a coaxial cable 52 having a length equal to one-quarter the wavelength (λ) of the signal at the desired resonant frequency of the field coil 12. In this case, the desired resonant frequency is the Larmor frequency of the objects to be imaged. Alternatively, the cable 52 can have a length equal to any odd integer multiple of one-quarter the wavelength of the signal at the desired resonant frequency (i.e. λ/4, 3λ/4, 5λ/4, etc.). However, signal loss in the cable will limit its practical length. The center conductor of cable 52 is directly connected at a first end 53 to the corresponding point on either end loop 15 or 16 of the field coil 12. The other coaxial conductor at the first end 53 is connected to the shield 14.

At the second end 54 of the coaxial cable 52, the center conductor is connected to the shield 14 by a series connection of variable capacitor 55 and inductor 56. In this embodiment, the coaxial cable 52 acts as an impedance inverter, that is, the impedance appearing at the first end 53 of the cable 52 is the inverse of the impedance at the second end 54 of the cable. The coaxial cable 52 has a relatively high characteristic impedance, which allows the use of components 55 and 56 having reasonable values in order to produce a wide range of impedances at the other end of the cable. Specifically, when the combination of the capacitor 55 and inductor 56 are tuned to appear as a short circuit at the excitation frequency of the coil, the inversion of this short circuit will appear as an open circuit between the end loop 15 or 16 and the shield 14. Likewise, by varying capacitor 55, a small capacitive or inductive impedance can be produced at the second end 54 of the coaxial cable 52, which is transformed into a large inductance or capacitance, respectively, at the first end 53 of the cable. This enables the reactive shunt of FIG. 3 to be adjusted to act as either a capacitor or an inductor extending between the field coil 12 and shield 14 at its respective location. Therefore, the reactive shunt circuit shown in FIG. 3 will have an identical function to the circuit shown in FIG. 2. The length of the transmission medium, coaxial cable 52, can vary from precisely an odd integer multiple of the wavelength of the signal at the desired resonant frequency, as long as the reactive shunt is adjustable to create the necessary range of reactances at the first end 53 of the cable.

Figure 4:
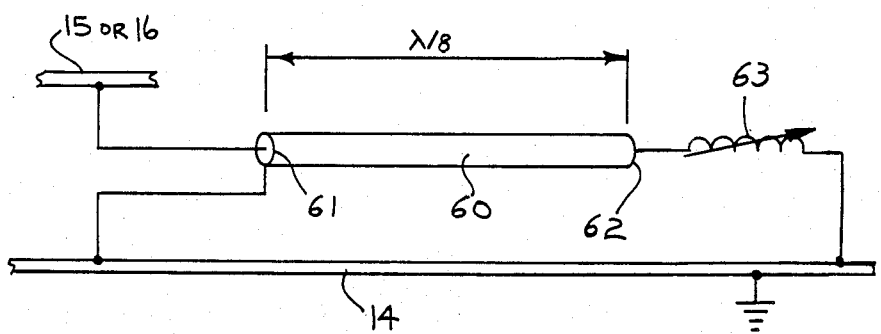

FIG. 4 illustrates yet another embodiment of the reactive shunts in which the tuning element is a single variable inductor 63. In this variation, a coaxial cable transmission medium 60 is connected at one end 61 to the respective coil end loop 15 or 16 and the shield 14. As illustrated the coaxial cable 60 has a length approximately equal to one-eighth the wavelength (λ) of the signal at the desired resonant frequency for the field coil 12. In this embodiment, the impedance transformation can be achieved by other lengths of cable which conform to the relationship:

$$L = \frac{(4n + 1)\lambda}{8}$$

where L is the length of the cable, n is a non-negative integer (i.e. n=0, 1, 2, 3, . . . ). However, in order to keep the loss through the transmission medium to a minimum, it is desirable to maintain the coaxial cable 60 as short as possible. The actual length of the coaxial cable 60 can vary from its computed length as long as the range of impedances producible at its first end 61 is sufficient to tune the coil 12.

The central conductor at the second end 62 of the coaxial cable 60 is connected to the shield 14 by a variable inductor 63. The one-eighth wavelength coaxial cable transforms the inductance of the inductor 63 to appear as an open circuit when the reactive shunt is properly tuned to the resonant frequency of the coil. This inductance can be increased or decreased from this nominal open circuit value so that the transformed impedance across the first end 61 of the cable will be a large capacitance or inductance . As with the previous embodiments of the reactive shunts, this adjustment of the inductor 63 can cause the resonant frequency of the coil 12 to be increased or decreased.

Figure 5:
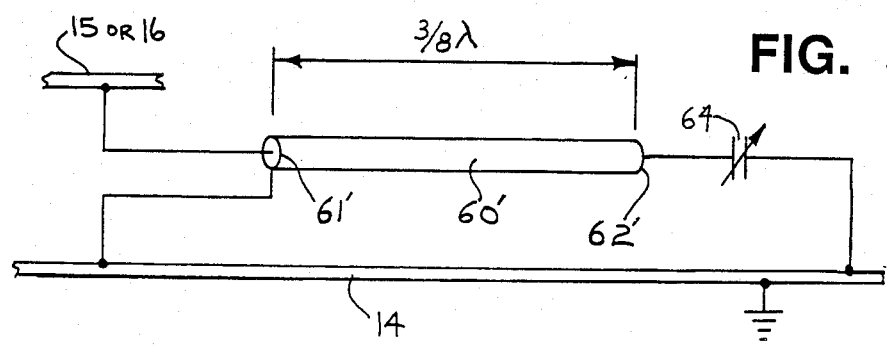

Alternatively, a variable capacitor 64 can be substituted for inductor 63 as shown in FIG. 5. In this case, the length of the cable 60' would be determined by the equation:

$$L = \frac{(4n + 3)\lambda}{8}$$

with the minimum length being ⅜ λ.

Regardless of the particular reactive shunt embodiments utilized in the coil assembly 10, the same method is employed to tune the field coil 12. As noted above, if the coil 12 is to operate as a true quadrature coil, both orthogonal modes must resonate at the same frequency. However, because of variations in the manufacturing tolerances of the coil and its components, one or both of the modes may resonate at other than the desired Larmor frequency. In order tune the resonant frequency of each mode using the reactive shunts 41–48, the direction of each mode and its resonant frequency must first be determined. This can be accomplished by inductively coupling a coil 71 of an excitation signal generator 70 to a location around the circumference of one of the end loops 15 or 16, as depicted in FIG. 6. A pickup coil 72, connected to a network analyzer 73, is inductively coupled to the same end loop, 180 degrees from the location of excitation. The network analyzer provides a plot of the strength of the signal from the pickup coil versus frequency.

The excitation signal from generator 70 is then swept through a range of frequencies about the Larmor frequency. The network analyzer 73 is observed to identify the frequencies at which the strongest signals are detected. If the excitation and pickup coils 71 and 72 are not aligned with the direction of one of the modes, the network analyzer 73 will likely indicate signal strength peaks at two frequencies in the plot. This indicates the frequencies of the two resonant modes of the untuned coil. In order to determine the direction of each mode, the excitation and pickup coils 71 and 72 are rotated about the circumference of the end loop and an excitation of the field coil at the two resonant frequencies is carried out at each location. When the two measurement coils 71 and 72 are placed perpendicular to the direction of one of the resonant modes, the intensity of the signal due to that mode will be zero. Whereas, when the two pickup coils are aligned with the direction of a resonant mode, the signal intensity due to that mode will be at a maximum value.

For example, FIG. 6 schematically illustrates end loop 16 with circles about its circumference representing the positions where each of the conductive segments 21–28 and the four reactive shunts 45–48 are coupled to that end loop. The two solid lines 65 and 66 within the end loop 16 represent the directions of the two orthogonal resonant modes. Therefore, if the excitation and pickup coils 71 and 72 are placed as illustrated, two peaks will be observed on the network analyzer 73 centered about the frequencies of the two orthogonal modes. When the excitation and pickup coils 71 and 72 are placed about the end loop 16 adjacent conductive segments 24 and 28, the peak centered about the resonant frequency of the mode oriented along direction 66 will be at its highest value, and the signal intensity for the peak centered about the resonant frequency of the mode along direction 65 will be nulled. Similarly, when the two measurement coils 71 and 72 are placed adjacent conductive segments 22 and 26, the signal intensity for the mode oriented along direction 66 will be nulled and the intensity of the signal at the frequency of the mode along direction 65 will be maximized.

In the example illustrated in FIG. 6, the two orthogonal modes are aligned with locations about conductive loop 16 at which its four reactive shunts 45–48 are coupled. Therefore, by adjustment of each of these reactive shunts, the resonant frequency for each mode can be forced to that of the Larmor frequency. For example, if the mode represented by direction 65 is resonating above the desired Larmor frequency, the reactive shunts that are orthogonal to the direction of the mode, shunts 46 and 48, can be adjusted to appear as capacitance at the points where conductive segments 24 and 28 connect to the end loop 16, The amount of capacitance added at these points of the coil determines the degree to which the resonant frequency of the corresponding mode is lowered. Similarly, if the mode pointing in direction 66 is below the desired Larmor frequency, the reactive shunts 45 and 47 can be adjusted to insert inductance between the end loop 16 and the shield 14 to increase the resonant frequency of that mode.

As each reactive shunt is adjusted, its effect on the resonant frequency of the respective mode can be observed on the network analyzer 73. Alternatively, for example where the reactive shunts are adjusted by a multi-turn variable capacitor, the variation in resonant frequency per turn of the capacitor can be calculated. In this case the adjustment can be accomplished without observation of the network analyzer by determining the amount of frequency variation needed and adjusting the capacitor accordingly. By raising or lowering the capacitance of the capacitor in FIG. 2, the impedance of the reactive shunt between the coil and the shield can be adjusted from the open circuit impedance to appear as either capacitance or inductance. Obviously, if one of the modes is already resonating at the desired Larmor frequency, no adjustment of the reactive shunts orthogonal to its direction need be made.

If the measurements carried out on the coil 12 determine that the two orthogonal modes are rotated 45 degrees from their orientation depicted in FIG. 6, the modes will have directions 67 and 68 indicated on FIG. 7. In this situation, the direction of the two modes are no longer aligned with the positions of the reactive shunts 45–48 coupled to the second end loop 16, but are aligned with the positions of the reactive shunts 41–44 coupled to the first loop 15. Therefore, in a manner similar to that described with respect to the orientation in FIG. 6, the first set of reactive shunts 41–44 coupled to end loop 15 can be adjusted to raise or lower the resonant frequencies of each of the modes.

A third type of orientation of the two modes is possible where their directions do not align with the positions about either of the conductive end loops 15 or 16 at which the reactive shunts 41–48 are coupled. In this situation illustrated in FIG. 8, a combination of several of the reactive shunts 41–48 are adjusted to eliminate the frequency imbalance. For modes in directions, such as 75 and 76, that point exactly between variable reactive shunts, the frequency of a mode can be changed by the equally varying the sets of shunts nearest to a line perpendicular to the mode's direction. Specifically, reactive shunts pairs 41/46, and 43/48 are adjusted to alter the resonant frequency of the mode in direction 75. Similarly, reactive shunt pairs 42/47 and 44/45 are adjusted to vary the resonant frequency of the orthogonal mode 76. If the line perpendicular to a mode points closer to one shunt than another, the two shunts can be adjusted in a weighted fashion to control the resonant frequency of the mode. Thus, modes pointing in any arbitrary direction can be controlled by a minimum number of adjustable reactive shunts, eight in the preferred embodiment.

Once these reactive shunts 41–48 have been adjusted to raise or lower the frequency of each resonant mode, the modes may shift to another set of orthogonal directions where their frequency difference now is the greatest. The process of sensing the mode directions and frequencies is then repeated for several iterations until no further direction shifts are detected or until the best adjustment is found.

I claim:

1. A radio frequency NMR coil assembly intended to resonate at a desired frequency comprising:

a cylindrical field coil having a pair of conductive end loops disposed in a spaced-apart relation along a central axis, and a plurality of conductive segments electrically interconnecting the pair of conductive end loops at points around each of said end loops, and said conductive segments including reactive shunts which have values that cause said field coil to resonate at a given frequency;

a shield disposed about said field coil; and a plurality of reactive shunts coupled between different locations about the periphery of the field coil and a common node, each of said reactive shunts being variable to increase or decrease the resonant frequency of the field coil.

2. The assembly as recited in claim 1 wherein said plurality of reactive shunts includes a first set of reactive shunts, each member shunt of the first set being coupled to said field coil at different locations around one of said conductive end loops.

3. The assembly as recited in claim 2 wherein said plurality of reactive shunts further includes a second set of reactive shunts, each member shunt of the second set being coupled to said field coil at different locations around one of said conductive end loops and offset from the locations at which the members of the first set of reactive shunts are coupled to said field coil.

4. The assembly as recited in claim 2 wherein said common node is said shield.

5. The assembly as recited in claim 1 wherein each of said reactive shunts includes a parallelly connected capacitor and inductor.

6. The assembly as recited in claim 1 wherein each of said reactive shunts includes an impedance inverter coupled to said field coil, and a series connection of a capacitor and an inductor between said impedance inverter and said common node.

7. The assembly as recited in claim 1 wherein each of said reactive shunts comprises:

a transmission medium having a length substantially equal to an odd integer multiple of one-quarter the wavelength of a signal at the desired frequency, and being coupled at one end to said field coil; and a series connection of a capacitor and an inductor coupled between the other end of said transmission medium and said common node.

8. The assembly as recited in claim 7 wherein said transmission medium is a coaxial cable.

9. The assembly as recited in claim 1 wherein each of said reactive shunts comprises:

a transmission medium having a length substantially equal to an odd integer multiple of one-eighth the wavelength of a signal at the desired frequency, and being coupled at one end to said field coil; and a variable reactance coupled between the other end of said transmission medium and said common node.

10. The assembly as recited in claim 1 wherein each of said reactive shunts comprises:

a transmission medium having a length L substantially equal to:

$$L = \frac{(4n + 1)\lambda}{8}$$

where n is a non-negative integer and the $\lambda$ is the wavelength of a signal at the desired frequency, and said transmission medium being coupled at one end to said field coil; and a variable inductor coupled between the other end of said transmission medium and said common node.

11. The assembly as recited in claim 1 wherein each of said reactive shunts comprises:

a transmission medium having a length L substantially equal to:

$$L = \frac{(4n + 3)\lambda}{8}$$

where n is a non-negative integer and the $\lambda$ is the wavelength of a signal at the desired frequency, and said transmission medium is coupled at one end to said field coil; and a variable capacitor coupled between the other end of said transmission medium and the common node.

12. The assembly as recited in claim 1 wherein each of said reactive shunts includes a means for transforming reactance coupled to said field coil; and a reactance coupled between said means for transforming reactance and said common node.

* * * * *